(12) United States Patent
Xu

(10) Patent No.: US 10,761,145 B2
(45) Date of Patent: Sep. 1, 2020

(54) ILLUMINATING FIXTURE AND DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Qianwen Xu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 400 days.

(21) Appl. No.: 15/577,190

(22) PCT Filed: Nov. 8, 2017

(86) PCT No.: PCT/CN2017/109827
§ 371 (c)(1),
(2) Date: Nov. 27, 2017

(87) PCT Pub. No.: WO2019/037279
PCT Pub. Date: Feb. 28, 2019

(65) Prior Publication Data
US 2019/0064286 A1 Feb. 28, 2019

(30) Foreign Application Priority Data
Aug. 22, 2017 (CN) .......................... 2017 1 0722916

(51) Int. Cl.
*G01R 31/44* (2020.01)
*H01L 51/00* (2006.01)
(Continued)

(52) U.S. Cl.
CPC ......... *G01R 31/44* (2013.01); *G01R 1/06794* (2013.01); *G09G 3/006* (2013.01);
(Continued)

(58) Field of Classification Search
CPC ............ G01R 1/06705; G01R 31/2656; G01R 31/2887; G01R 31/308
See application file for complete search history.

(56) References Cited

U.S. PATENT DOCUMENTS 3,437,929 A * 4/1969 Glenn ................ G01R 1/06705
324/750.22
4,607,525 A * 8/1986 Turner ................ G01B 13/065
324/750.19
(Continued)

FOREIGN PATENT DOCUMENTS

CN 1639577 A 7/2005
CN 101685133 A 3/2010
(Continued)

*Primary Examiner* — Walter L Lindsay, Jr.
*Assistant Examiner* — Milton Gonzalez
(74) *Attorney, Agent, or Firm* — Kirton McConkie; Evan R. Witt

(57) ABSTRACT

An illuminating fixture and a device are provided. The illuminating fixture includes an intelligence control system, a scanning system, wires, and at least two sets of probes. One end of the probe is connected with a probe arm, and the probe arm is configured to control a slide movement of the probe along an up and down direction and rotation of the probe. the scanning system positions a measurement position of a test element group, and the intelligence control system is configured to automatically adjust a position of the probe by the probe arm according to the measurement position positioned by the scanning system.

10 Claims, 2 Drawing Sheets

(51) Int. Cl.
*G09G 3/00* (2006.01)
*G01R 1/067* (2006.01)
*G01R 31/28* (2006.01)
*H01L 27/32* (2006.01)

(52) U.S. Cl.
CPC ...... *H01L 51/0031* (2013.01); *G01R 31/2825* (2013.01); *H01L 27/3223* (2013.01)

(56) References Cited

U.S. PATENT DOCUMENTS

| | | |
|---|---|---|
| 2003/0178988 A1 | 9/2003 | Kim |
| 2015/0204908 A1 | 7/2015 | Ku et al. |
| 2016/0305979 A1* | 10/2016 | Liu ........................ G09G 3/006 |
| 2018/0247578 A1 | 8/2018 | Wang et al. |

FOREIGN PATENT DOCUMENTS

| | | |
|---|---|---|
| CN | 104062503 A | 9/2014 |
| CN | 104714056 A | 6/2015 |
| CN | 106910444 A | 6/2017 |
| CN | 107037636 A | 8/2017 |

* cited by examiner

ILLUMINATING FIXTURE AND DEVICE

FIELD OF DISCLOSURE

The present disclosure relates to the field of flat display illuminating test technology, and more particularly to an illuminating fixture and a device.

BACKGROUND

In flat display technology, advantages of organic light emitting diode displays (OLEDs) include being thin, active emitting, fast response times, wide viewing angles, wide color gamut, high brightness, and low energy consumption, so OLED displays have gradually become a third generation display technology after liquid crystal displays (LCDs). In comparison to LCDs, OLEDs offer advantages of low energy consumption, thinness, and wide viewing angles. Nowadays, people are placing increasing demands on the resolution of displays. However, manufacturing OLEDs having high quality and high resolution still presents many challenges.

In current OLED design, OLEDs include complex pixel circuits, such that in design of high resolution products, there are stringent requirements on manufacturing process. Hence, in order to more timely and accurate monitor products, a test circuit having a test point corresponding to each component is usually provided in the OLEDs. By measuring each test circuit, parameters of each component are obtained.

There are few fixtures designed to illuminate OLED test element group (TEG), all of which are "snap-on cover type" fixtures in current laboratory practice. When light emits from a top of a fixture, probes contact anodes and cathodes of a TEG at a cover of the fixture, by which measurement of viewing angle of luminescent points of the TEG is limited, and it cannot use to multi-angle and large-angle measurement. Also, a fixture can only be used for illuminating one kind of TEGs, resulting in a waste of resources. Furthermore, there is no consideration of thickness difference of TEG in design of the fixture, so it easily causes poor contact and damage to probes.

SUMMARY OF DISCLOSURE

The present disclosure provides an illuminating fixture and device, so as to solve technical problem caused by existing illuminating fixtures not measuring a panel under-test in multi-angle and large-angle measurements after illuminating a test element group.

In order to achieve the objects described above, the technical solution provided by the present disclosure is as follows.

The present disclosure provides an illuminating fixture, including a sample placement area, at least two luminescent point control switches, an intelligence control system, a scanning system, a printed circuit board, wires, and at least two sets of probes, where one end of the probe is connected with a probe arm, and the probe arm is configured to control a slide movement of the probe along an up and down direction and rotation of the probe;

the scanning system positions a measurement position of the test element group, and the intelligence control system is configured to automatically adjust a position of the probe by the probe arm according to the measurement position positioned by the scanning system.

According to one preferred embodiment of the present disclosure, the luminescent point control switch corresponds to a luminescent point of the test element group, and each luminescent point control switch is capable of lighting up one luminescent point; and where the luminescent point control switch includes a top light switch and a bottom light switch of the test element group.

According to one preferred embodiment of the present disclosure, each set of the probes includes a cathode probe and an anode probe, the probe arm for controlling the probe is connected with a transmission device, and the transmission device includes a lift frame and a mechanical lever; and where the mechanical lever is controlled by the intelligence control system, and a position of the probe arm is controlled by the mechanical lever and the lift frame.

According to one preferred embodiment of the present disclosure, the probe has a pressure sensor; and the probe arm is configured to control a pressure exerted on the probe using the pressure sensor, such that the probes are adaptable to a test element group of different thicknesses.

According to one preferred embodiment of the present disclosure, when operation of the illuminating fixture is stopped, the probe is locked in the illuminating fixture.

The present disclosure provides an illuminating fixture device, including an illuminating fixture, which includes a sample placement area, at least two luminescent point control switches, an intelligence control system, a scanning system, a printed circuit board, a wire, and at least two sets of probes, where one end of the probe is connected with a probe arm, and the probe arm is configured to control a slide movement of the probe along an up and down direction and rotation of the probe; and the scanning system positions a measurement position of the test element group, and the intelligence control system is configured to automatically adjust a position of the probe by the probe arm according to the measurement position positioned by the scanning system.

According to one preferred embodiment of the present disclosure, the luminescent point control switch corresponds to a luminescent point of the test element group, and each luminescent point control switch is capable of lighting up one luminescent point; and where the luminescent point control switch includes a top light switch and a bottom light switch of the test element group.

According to one preferred embodiment of the present disclosure, each set of the probes includes a cathode probe and an anode probe, the probe arm for controlling the probe is connected with a transmission device, and the transmission device includes a lift frame and a mechanical lever; and where the mechanical lever is controlled by the intelligence control system, and a position of the probe arm is controlled by the mechanical lever and the lift frame.

According to one preferred embodiment of the present disclosure, the probe has a pressure sensor; and the probe arm is configured to control a pressure exerted on the probe using the pressure sensor, such that the probes are adaptable to a test element group of different thicknesses.

According to one preferred embodiment of the present disclosure, when operation of the illuminating fixture is stopped, the probe is locked in the illuminating fixture.

The present disclosure also provides an illuminating fixture, including a sample placement area, at least two luminescent point control switches, an intelligence control system, a scanning system, a printed circuit board, wires, and at least two sets of probes, where one end of the probe is connected with a probe arm, and the probe arm is configured to control a slide movement of the probe along an up and down direction and rotation of the probe;

the scanning system positions a measurement position of the test element group, and the intelligence control system is configured to automatically adjust a position of the probe by the probe arm according to the measurement position positioned by the scanning system.

According to one preferred embodiment of the present disclosure, the luminescent point control switch corresponds to a luminescent point of the test element group, and each luminescent point control switch is capable of lighting up one luminescent point; and where the luminescent point control switch includes a top light switch and a bottom light switch of the test element group.

According to one preferred embodiment of the present disclosure, each set of the probes includes a cathode probe and an anode probe, the probe arm for controlling the probe is connected with a transmission device, and the transmission device includes a lift frame and a mechanical lever; and where the mechanical lever is controlled by the intelligence control system, and a position of the probe arm is controlled by the mechanical lever and the lift frame.

According to one preferred embodiment of the present disclosure, when operation of the illuminating fixture is stopped, the probe is locked in the illuminating fixture.

The advantages of the present disclosure are as follows. In comparison to prior art, the present disclosure provides an illuminating fixture and a device. The illuminating fixture is suitable for a plurality of types of test element groups, thereby saving resources and being easy to operate. By setting a probe pressure sensor, pressure exerted on a probe can be controlled, thereby protecting the probe from poor contact and being damage. Additionally, when operation of the illuminating fixture is stopped, the probe is locked in the illuminating fixture, so as to prevent damage of the probe.

BRIEF DESCRIPTION OF DRAWINGS

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

In the drawings.

Figure 1:
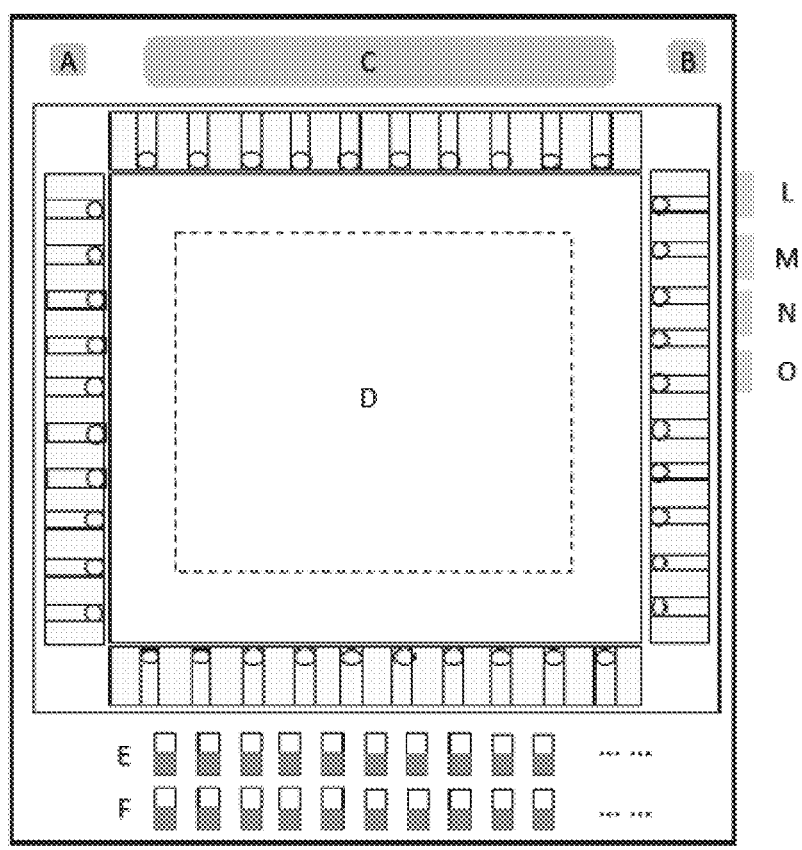
FIG. 1 is a top view of an illuminating fixture of a preferred embodiment of the present disclosure.

A: raise button; B: lower button; C: display; D: sample placement area; E: top light switch; F: bottom light switch; H: axis of holder; I: axis of the probe; K: holder; L: key for applying pressure on probe; M: pressure increase key; N: pressure decrease key; O: control key; P: scanning system; Q: switch with sensor; R: anode; S: cathode; T: wire; U: retractable mechanical lever; V: intelligence control system; W: printed circuit board

DETAILED DESCRIPTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

In comparison to the present disclosure, a prior art illuminating fixture has a single purpose, and one fixture can only illuminate a test element group, such that after the test element group is illuminated, a panel under-test cannot be measured in multi-angle and large angle. Moreover, there is no consideration of thickness difference of test element groups, so it easily causes poor contact and damage of probes. Thus, the present disclosure provides an illuminating fixture and a device, by which the disadvantages of the prior art can be improved.

Figure 2:
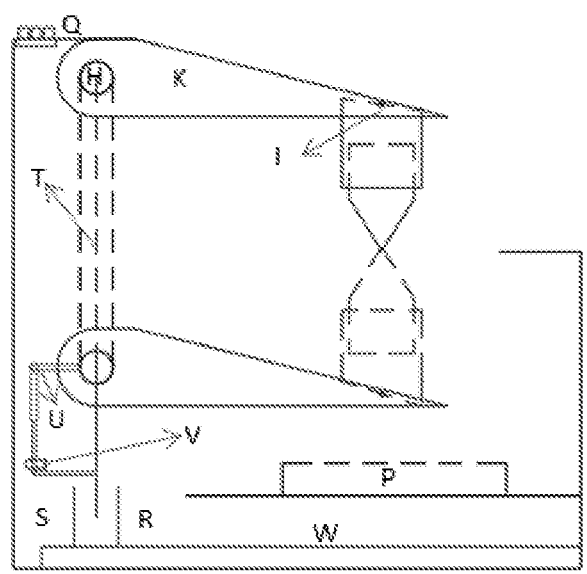
FIG. 2 is a side view of an illuminating fixture of a preferred embodiment of the present disclosure.

FIG. 1 and FIG. 2 are a top view and a side view of an illuminating fixture of a preferred embodiment of the present disclosure, respectively. The illuminating fixture includes a sample placement area D, at least two luminescent point control switches, an intelligence control system V, a scanning system P, a printed circuit board W, wires, and at least two sets of probes.

The luminescent point control switches correspond to luminescent points of the test element group. Each luminescent point control switch is used for illuminating one luminescent point. The luminescent point control switch includes a top light switch E and a bottom light switch F of the test element group. The scanning system P is configured to determine a measurement position of the test element group.

One end of the probe is connected with a probe arm, and the probe arm is configured to control a slide movement of the probe along an up and down direction and rotation of the probe. The scanning system P positions the measurement position of the test element group, and the intelligence control system V is configured to automatically adjust a position of the probe by the probe arm according to the measurement position positioned by the scanning system P. After the test element group is illuminated by using the probe arm, a panel under-test can be tested in multi-angles and large-angle measurement by the probe.

Each set of probes includes a cathode probe S and an anode probe R. The probe arm, for controlling the probes, is connected with a transmission device, which includes a lift frame and a mechanical lever U.

The mechanical lever U is controlled by the intelligence control system. The position of the probe arm is controlled by the mechanical lever U and the lift frame.

Moreover, the probe has a pressure sensor. The illuminating fixture controls the pressure exerted on the probe through the pressure sensor, so the probe is adaptable to the test element groups with different thicknesses.

The probe has flexibility. Thus, when operation of the illuminating fixture is stopped, the probe is locked in the illuminating fixture.

First Embodiment

As shown in FIG. 1, in this preferred embodiment, the illuminating fixture includes 40 probes. The switch of the illuminating fixture is located at position Q. The illuminating fixture is operated by adjusting the switch located at position Q Particular process includes the following steps. The switch located at position Q of the illuminating fixture is on, so that a sensing device transmits a received position signal to the intelligence control system V. After receiving the signal of the sensing device, the intelligence control system V pushes a metal piece at the bottom of the wires to a cathode S contact piece or an anode R contact piece by controlling the retractable mechanical lever U. In addition, the probes can rotate along an axis I of the probes, and can slide up and down along an axis H of a holder. The probes can also slide left and right. After a sample is put in, the scanning system P, located on the periphery of the sample, will automatically scan the position of the luminescent points of the test element group. The position of the probes will be automatically adjusted according to the position of the luminescent points of the test element group.

In the present embodiment, in use the illuminating fixture, when the test element group is a top-emitting type, the test element group to be tested is placed on a placement area of the OLED test element group. When a lower button A is pressed, the illuminating fixture will automatically lift the holder and turn the probes downward. When the sensor in the placement area of the OLED test element group senses a sample is being put in, the system automatically rotates the holder to the position shown on the right in the figure and moves the holder downward, so that the probes contact with the luminescent points of the test element group.

Furthermore, the system can adjust height of each probe by the pressure sensor set on each of the probes to ensure that all the probes apply the same pressure on the luminescent points of the test element group. The magnitude of the pressure is adjusted by pressing a pressure increase key M and a pressure decrease key N on the side of the illuminating fixture. Through the display, a real-time pressure value and the pressure value to be set can be observed.

A switch E below the illuminating fixture controls the turning on and off of the luminescent points of the test element group, where each switch controls one luminescent point of the test element group.

When the illuminating operation is completed, the probes will automatically rise and rotate to a vertical state by pressing a control key O. Also, a lift frame located below the placement area of the OLED test element group is raised, and the test element group to be tested is supported. When the test element group to be tested is removed, a pressure sensor on the lift frame will automatically back down, and the system will control the holder and the probes to return to an initial state.

When using the illuminating fixture, in the present embodiment, the test element group is placed with a light-emitting surface facing upwards into the illuminating fixture. When a lower button B is pressed and the system senses the test element group is placed on, the probes will automatically extend, and a direction and pressure of the probes will be adjusted. The above process will repeat. The luminescent points of the test element group being turned on and off is controlled a switch F which is located below the illuminating fixture, where each switch controls one luminescent point of the test element group.

Finally, when the illuminating fixture stops working, the system will automatically control the probe and retract the probe into the probe arm to ensure that the probe will not be damaged.

The present disclosure also provides an illuminating fixture device, which includes an illuminating fixture. The illuminating fixture includes a sample placement area D, at least two luminescent point control switches, an intelligence control system V, a scanning system P, a printed circuit board W, wires, and at least two sets of probes.

The luminescent point control switches correspond to luminescent points of the test element group. Each luminescent point control switch is used for illuminating one luminescent point. The luminescent point control switch includes a top light switch and a bottom light switch of the test element group. The scanning system P is configured to determine a measurement position of the test element group.

One end of the probe is connected with a probe arm, and the probe arm is configured to control a slide movement of the probe along an up and down direction and rotation of the probe. The scanning system P positions the measurement position of the test element group, and the intelligence control system V is configured to automatically adjust a position of the probe according to the measurement position positioned by the scanning system P. After the test element group is illuminated by using the probe arm, a panel under-test can be tested in multi-angle and large-angle measurement by the probe.

Each set of probes includes a cathode probe S and an anode probe R. The probe arm, for controlling the probes, is connected with a transmission device, which includes a lift frame and a mechanical lever U.

The mechanical lever U is controlled by the intelligence control system. The position of the probe arm is controlled by the mechanical lever U and the lift frame.

Moreover, the probe has a pressure sensor. The illuminating fixture controls the pressure exerted on the probe through the pressure sensor, so the probe is adaptable to test element group with different thicknesses;

The probe has flexibility. Thus, when operation of the illuminating fixture is stopped, the probe is locked in the illuminating fixture.

A specific embodiment of the illuminating fixture device is similar to the first embodiment, and details are not described herein again.

The present disclosure provides an illuminating fixture and a device. The illuminating fixture includes a sample placement area, at least two luminescent point control switches, an intelligence control system, a scanning system, a printed circuit board, wires, and at least two sets of probes, where one end of the probe is connected with a probe arm, and the probe arm is configured to control a slide movement of the probe along an up and down direction and rotation of the probe. The scanning system positions a measurement position of the test element group, and the intelligence control system is configured automatically adjust a position of the probe by the probe arm according to the measurement position positioned by the scanning system. Thus, the illuminating fixture can be used to illuminate a plurality of types of test element group, thereby saving resources and being easy to operate. By setting a probe pressure sensor, pressure exerted on a probe can be controlled, thereby protecting the probe from poor contact and being damage. Additionally, when operation of the illuminating fixture is stopped, the probe is locked in the illuminating fixture, so as to prevent damage to the probe.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. An illuminating fixture, comprising a sample placement area, at least two luminescent point control switches, an intelligence control system, a scanning system, a printed circuit board, wires, and at least one set of probes,
   wherein one end of the probe is connected with a probe arm, and the probe arm is configured to control a slide movement of the probe along an up and down direction and rotation of the probe;
   the probe has a pressure sensor, the probe arm is configured to control pressure exerted on the probe using the pressure sensor, such that the probes are adaptable to a test element group of different thicknesses;
   wherein the scanning system positions a measurement position of the test element group, and the intelligence control system is configured to automatically adjust a position of the probe by the probe arm according to the measurement position positioned by the scanning system;
   wherein the at least one set of the probes comprises a cathode probe and an anode probe, the probe arm is configured to control the probe and is connected with a transmission device, and wherein the transmission device comprises a lift frame and a mechanical lever; and
   wherein the mechanical lever is controlled by an intelligence control system, and a position of the probe arm is controlled by the mechanical lever and the lift frame.

2. The illuminating fixture as claimed in claim 1, wherein the luminescent point control switch corresponds to a luminescent point of the test element group, and each luminescent point control switch is capable of lighting up one luminescent point; and
   wherein the luminescent point control switch comprises a top light switch and a bottom light switch of the test element group.

3. The illuminating fixture as claimed in claim 1, wherein when operation of the illuminating fixture is stopped, the probe is locked in the illuminating fixture.

4. An illuminating fixture device, comprising an illuminating fixture comprising a sample placement area, at least two luminescent point control switches, an intelligence control system, a scanning system, a printed circuit board, a wire, and at least one set of probes,
   wherein one end of the probe is connected with a probe arm, and the probe arm is configured to control a slide movement of the probe along an up and down direction and rotation of the probe;
   wherein the scanning system positions a measurement position of the test element group, and the intelligence control system is configured to automatically adjust a position of the probe by the probe arm according to the measurement position positioned by the scanning system;
   wherein the at least one set of the probes comprises a cathode probe and an anode probe, the probe arm is configured to control the probe and is connected with a transmission device, and wherein the transmission device comprises a lift frame and a mechanical lever; and
   wherein the mechanical lever is controlled by an intelligence control system, and a position of the probe arm is controlled by the mechanical lever and the lift frame.

5. The illuminating fixture device as claimed in claim 4, wherein the luminescent point control switch corresponds to a luminescent point of the test element group, and each luminescent point control switch is capable of lighting up one luminescent point; and
   wherein the luminescent point control switch comprises a top light switch and a bottom light switch of the test element group.

6. The illuminating fixture device as claimed in claim 4, wherein the probe has a pressure sensor; and
   the probe arm is configured to exert a pressure on the probe using the pressure sensor, such that the probes are adaptable to a test element group of different thicknesses.

7. The illuminating fixture device as claimed in claim 4, wherein when operation of the illuminating fixture is stopped, the probe is locked in the illuminating fixture.

8. An illuminating fixture, comprising: a sample placement area, at least two luminescent point control switches, an intelligence control system, a scanning system, a printed circuit board, a wire, and at least one set of probes,
   wherein one end of the probe is connected with a probe arm which is capable of controlling an up and down slide movement of the probe and rotation of the probe;
   the scanning system positions a measurement position of the test element group, and the intelligence control system is configured to automatically adjust a position of the probe by the probe arm according to the measurement position positioned by the scanning system;
   wherein the at least one set of the probes comprises a cathode probe and an anode probe, the probe arm is configured to control the probe and is connected with a transmission device, and wherein the transmission device comprises a lift frame and a mechanical lever; and
   wherein the mechanical lever is controlled by an intelligence control system, and a position of the probe arm is controlled by the mechanical lever and the lift frame.

9. The illuminating fixture as claimed in claim 8, wherein the luminescent point control switch corresponds to a luminescent point of the test element group, and each luminescent point control switch is capable of lighting up one luminescent point; and
   wherein the luminescent point control switch comprises a top light switch and a bottom light switch of the test element group.

10. The illuminating fixture as claimed in claim 8, wherein when operation of the illuminating fixture is stopped, the probe is locked in the illuminating fixture.

* * * * *